(12) United States Patent
Kihara et al.

(10) Patent No.: US 7,270,916 B2
(45) Date of Patent: Sep. 18, 2007

(54) RECORDING MEDIUM

(75) Inventors: Naoko Kihara, Matsudo (JP); Katsutaro Ichihara, deceased, late of Yokohama (JP); by Urara Ichihara, legal representative, Yokohama (JP); Akiko Hirao, Chiba (JP); Kazuki Matsumoto, Kawasaki (JP); Hideyuki Nishizawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 10/868,803

(22) Filed: Jun. 17, 2004

(65) Prior Publication Data
US 2005/0026079 A1 Feb. 3, 2005

(30) Foreign Application Priority Data
Jun. 18, 2003 (JP) ............................ 2003-173468

(51) Int. Cl.
*G03F 7/039* (2006.01)
*G03H 1/04* (2006.01)

(52) U.S. Cl. .................... 430/2; 430/270.1; 430/280.1; 430/287.1; 430/290; 430/910; 430/914; 430/927

(58) Field of Classification Search ................. 430/2, 430/270.1, 280.1, 910, 287.1, 927, 914, 290.1
See application file for complete search history.

(56) References Cited

U.S. PATENT DOCUMENTS 6,221,536 B1* 4/2001 Dhar et al. .................... 430/1
6,489,065 B1* 12/2002 Dhal et al. .................... 430/2
6,627,354 B1 9/2003 Chandross et al.
2003/0064303 A1* 4/2003 Nishimura et al. ........... 430/11

FOREIGN PATENT DOCUMENTS

| JP | 2000-86914 | 3/2000 |
| JP | 2000-511302 | 8/2000 |
| JP | 2000-250382 | 9/2000 |

OTHER PUBLICATIONS

Hideo Tanigawa, et al., "Photopolymer for Recording Holograms", Journal of Photopolymer Science and Technology, vol. 14, No. 2, 2001, pp. 281-284.

M.L. Schilling, et al., "Acrylate Oligomer-Based Photopolymers for Optical Storage Applications", Chem. Mater, vol. 11, 1999, pp. 247-254.

* cited by examiner

*Primary Examiner*—Richard L. Schilling
(74) *Attorney, Agent, or Firm*—Oblon, Spivak, McClelland, Maier & Neustadt, P.C.

(57) ABSTRACT

Disclosed is a recording medium comprising a recording layer including a photo-acid generating agent that generates an acid upon irradiation with an actinic radiation and a polymer having a polymerizable substituent group bonded to a main chain of the polymer via a functional group that cleaves in the presence of the acid.

19 Claims, 2 Drawing Sheets

RECORDING MEDIUM

CROSS-REFERENCE TO RELATED APPLICATIONS

This application is based upon and claims the benefit of priority from prior Japanese Patent Application No. 2003-173468, filed Jun. 18, 2003, the entire contents of which are incorporated herein by reference.

BACKGROUND OF THE INVENTION

1. Field of the Invention

The present invention relates to a recording medium, particularly, to a holographic optical recording medium.

2. Description of the Related Art

The development of an information storage device and an information storage method is being directed to the increase in the recording capacity. As a part of the development, proposed is a holography system using a holography display. As a recording medium of such a recording system, proposed is a so-called "photopolymer" utilizing a change in the optical characteristics caused by, the polymerization of a photo-polymerizable compound.

In the recording medium containing a photopolymer, shrinkage of the recording medium is induced by the polymerization of the photosensitive monomer. To be more specific, since the polymerized monomer occupies volume smaller than that occupied by the individual monomer, a local shrinkage is generated in each step of writing data in the recording medium. Where locally shrunk regions are combined, it is difficult to withdraw accurately the stored data.

As a measure for the volume compensation in a holographic optical recording medium, proposed in the past was a combination of systems capable of forming an optical image and capable of phase separation from the polymer matrix or a combination of compounds that can be cleaved by an acid.

However, in any of these measures, the recording layer of a recording medium is formed under the state that compounds having a low molecular weight are dispersed in a matrix. Where migration of the low molecular weight compounds within the recording layer is expected in the composition, it was difficult in the past to guarantee the stability during the store of the recording medium. Also, since the composition of the recording layer material containing a low molecular weight compound is in a liquid form, required is a liquid holding mechanism in forming a film. To be more specific, required is a bank structure for retaining a liquid film in a space between adjacent holding substrates. Further, in a solution of the composition of the recording layer material, a change in the composition is generated by the evaporation of the component, with the result that the film quality tends to be rendered nonuniform by, the phase separation of the component after the film formation.

BRIEF SUMMARY OF THE INVENTION

According to one aspect of the present invention, there is provided a recording medium comprising a recording layer including a photo-acid generating agent that generates an acid upon irradiation with an actinic radiation and a polymer having a polymerizable substituent group bonded to a main chain of the polymer via a functional group that cleaves in the presence of the acid.

Incidentally, the term "actinic radiation" noted above denotes a light ray used for the recording including, for example, a visible light ray or an ultraviolet light ray.

DETAILED DESCRIPTION OF THE INVENTION

Figure 1:
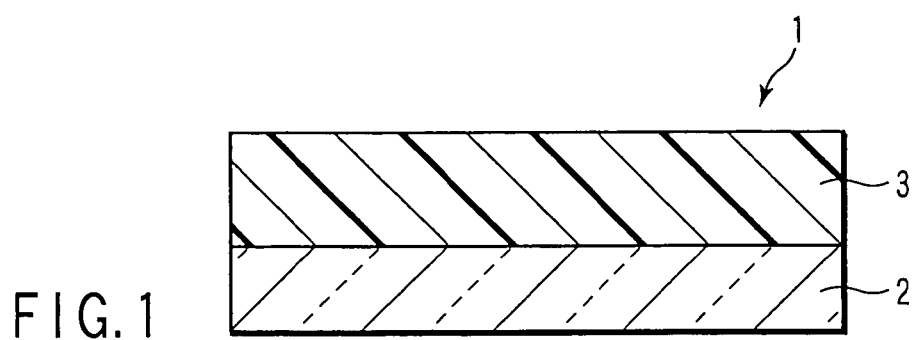
FIG. 1 is a cross sectional view schematically showing the construction of a recording medium according to one embodiment of the present invention.

An embodiment of the present invention will now be described.

A polymer having a polymerizable substituent group bonded to the main chain via an acid cleaving substituent group interposed therebetween is contained in the recording layer of a recording medium according to an embodiment of the present invention together with a compound generating an acid upon irradiation with an actinic radiation, which is hereinafter referred to as "a photo-acid generating agent". The polymerizable substituent group concerns to the recording and has a refractive index higher or lower than that of the polymer backbone chain. Therefore, the acid cleaving group of the polymer is allowed to release active molecules upon irradiation with light, and the recording is performed by the diffusion/reaction of the released active molecules. In addition, the released active molecules serve to suppress the change in volume of the recording layer.

The construction of the polymer used in the embodiment of the present invention is not particularly limited as far as a polymerizable substituent group is bonded to the main chain of the polymer with a bivalent functional group capable of cleavage in the presence of an acid interposed therebetween. To be more specific, the polymer includes, for example, a polymer obtained by polymerization of a monomer having an unsaturated bond such as an acrylic acid derivative, a styrene derivative, or a vinyl derivative, a high molecular weight compound synthesized by the ring scission polymerization of an epoxy derivative, an oxetane derivative, lactone or a lactam derivative, as well as novolak, polyimide and polyamide.

The polymer having a polymerizable substituent group bonded to the main chain with a bivalent functional group that can be cleaved in the presence of an acid interposed therebetween includes, for example, a polymer having a repeating unit represented by following general formula (1):

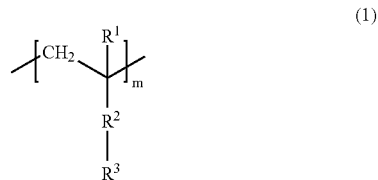

(1)

$R^1$ in the general formula (1) given above denotes a hydrogen atom, a halogen atom, a cyano group or a monovalent organic group. An alkyl group such as a methyl group or an ethyl group is used as the monovalent organic group. It is desirable for the monovalent organic group to have 2 or less carbon atoms. Where the monovalent organic group has three or more carbon atoms, the polymerization reaction tends to be impaired. It is possible for at least one hydrogen atom in the monovalent organic group to be replaced by a substituent group such as a halogen atom, or a cyano group.

$R^2$ in the general formula (1), which denotes a bivalent organic group that can be cleaved under the function of an acid catalyst so as to dissociate $R^3$, includes, for example, a linear or branched alkyl group, a cyclic alkyl group, a hetero ring, or an aromatic ring. It is possible for an unsaturated bond or a substituent group to be introduced into a part of the organic group represented by $R^2$.

Also, it is possible for $R^2$ to include a bivalent organic group $R^4$. To be more specific, it is possible for $R^2$ to include a substituted or unsubstituted cyclic or linear alkyl group, phenyl group, carbonyl group and sulfonyl group. As the structure that facilitates the introduction of a dissociation group by an acid catalyst, it is desirable for $R^4$ to be a carbonyl group and a sulfonyl group. It is possible for at least one hydrogen atom in these atomic groups to be replaced by the substituent group referred to above.

The atomic groups included in the substituent group that can be decomposed and dissociated by the acid catalytic reaction include, for example, esters, ethers, alkoxy carbonates, acetals, ketals, cyanohydrins, and dissociating alicyclic skeletons. To be more specific, the atomic groups noted above include, for example, esters such as t-butyl ester, isopropyl ester, ethyl ester, methyl ester, and benzyl ester; ethers such as tetrahydropyranyl ether; alkoxy carbonates such as t-butoxy carbonate, methoxy carbonate, and ethoxy carbonate; silyl ethers such as trimethyl silyl ether, triethyl silyl ether, and triphenyl silyl ether; esters such as isopropyl ester, tetrahydropyranyl ester, tetrahydrofuranyl ester, methoxy ethoxy methyl ester, 2-trimethyl silyl ethoxy methyl ester, 3-oxo cyclohexyl ester, isobornyl ester, trimethyl silyl ester, triethyl silyl ester, isopropyl dimethyl silyl ester, di-t-butyl methyl silyl ester, oxazole, 2-alkyl-1,3-oxazoline, 4-alkyl-5-oxo-1,3-oxazoline, and 5-alkyl-4-oxo-1,3-dioxolan; ethers such as t-butoxy carbonyl ether, t-butoxy methyl ether, 4-pentenyloxy methyl ether, tetrahydropyranyl ether, tetrahydro thiopyranyl ether, 3-bromo tetrahydropyranyl ether, 1-methoxy cyclohexyl ether, 4-methoxy tetrahydropyranyl ether, 4-methoxy tetrahydro thiopyranyl ether, 1,4-dioxane-2-yl ether, tetrahydro furanyl ether, tetrahydro thiofuranyl ether, 2,3,3a,4,5,6,7,7a-octahydro-7,8,8-trimethyl-4,7-methano benzofuran-2-yl ether, t-butyl ether, trimethyl silyl ether, triethyl silyl ether, triisopropyl silyl ether, dimethyl isopropyl silyl ether, diethyl isopropyl silyl ether, dimethyl thexyl silyl ether, and t-butyl dimethyl silyl ether; acetals such as methylene acetal, ethylidene acetal, and 2,2,2-trichloroethylidene acetal; ketals such as 1-t-butyl ethylidene ketal, isopropylidene ketal (acetonide), cyclopentylidene ketal, cyclohexylidene ketal, and cycloheptylidene ketal; cyclic ortho esters such as methoxy methylene acetal, ethoxy methylene acetal, dimethoxy methylene ortho ester, 1-methoxy ethylidene ortho ester, 1-ethoxy ethylidene ortho ester, 1,2-dimethoxy ethylidene ortho ester, 1-N,N-dimethyl amino ethylidene ortho ester, and 2-oxa cyclopentylidene ortho ester; silyl ketene acetals such as trimethyl silyl ketene acetal, triethyl silyl ketene acetal, and t-butyl dimethyl silyl ketene acetal; silyl ethers such as di-t-butyl silyl ether, 1,3-1',1',3',3'-tetraisopropyl disiloxanylidene ether, tetra-t-butoxy disiloxane-1,3-diilydene ether; non-cyclic acetals and non-cyclic ketals such as dimethyl acetal, dimethyl ketal, bis-2,2,2-trichloroethyl acetal, bis-2,2,2-trichloroethyl ketal, diacetyl acetal, and diacetyl ketal; cyclic acetals and cyclic ketals such as 1,3-dioxane, 5-methylene-1,3-dioxane, 5,5-dibromo-1,3-dioxane, 1,3-dioxolan, 4-bromomethyl-1,3-dioxolan, 4-3'-butenyl-1,3-dioxolan, and 4,5-dimethoxy methyl-1,3-dioxolan; cyanohydrins such as O-trimethyl silyl cyanohydrin, O-1-ethoxy ethyl cyanohydrin, O-tetrahydro pyranyl cyanohydrin; and an dissociating alicyclic skeleton such as a tertiary alicyclic ester having an alkyl group.

$R^3$ in the general formula (1), which denotes a monovalent organic group having at least one polymerizable substituent group, is bonded to the backbone chain of the polymer with $R^2$ referred to above interposed therebetween. The polymerizable substituent group includes, for example, an organic group having a hetero atom such as an acrylic group, an epoxy group, an oxetane group, lactam, oxazole and lactone and unsaturated group such as a double bond or a triple bond. These polymerizable substituent groups can be optionally selected in accordance with the object.

The monovalent organic group may include, for example, substitusted or unsubstituted aryl group such as naphthalene, anthracene, phenanthrene, and carbazole; linear or branched alkyl group; alicyclic group such as cyclohhexyl norbornyl, and adamantyl.

It is possible for the polymer having a repeating unit represented by the general formula (1) to be a homopolymer or a copolymer with another repeating unit having the structure described above. In the case of the copolymer, it is desirable for the repeating unit represented by the general formula (1) to be present in an amount of at least 10%. Where the amount of the repeating unit represented by the general formula (1) is smaller than 10%, it is difficult to obtain sufficiently the effect produced by the repeating unit represented by the general formula (1).

The polymer having the repeating unit represented by the general formula (1) can be synthesized by, for example, as follows. In the first step, an unsaturated compound having an acid cleaving substituent group is synthesized, followed by subjecting the synthesized unsaturated compound to homopolymerization or copolymerization. Then, a polymerizable substituent group is introduced into a terminal of a side chain, thereby synthesizing the polymer having the repeating unit represented by the general formula (1).

The polymer according to the embodiment of the present invention is formed into a film and, thus, it is desirable for the polymer to have a glass transition temperature not lower than 40° C. Incidentally, the upper limit of m in the general formula (1) is determined in view of the glass transition temperature of the polymer.

A raw material composition for forming a recording layer included in the recording medium according to the embodiment of the present invention can be obtained by mixing a photo-acid generating agent with the polymer synthesized as described above.

The photo-acid generating agent is not particularly limited as far as the release of acid can be controlled by an appropriate recording light wavelength. In general, the compounds used as the photo-acid generating agent include, for example, various onium salts, sulfonic acid esters, and sulfonyl compounds, which are used in chemically amplified resist.

To be more specific, the photo-acid generating agent includes, for example, an aryl onium salt, a naphthoquinone diazide compound, a diazonium salt, a sulfonate compound, a sulfonium compound, a sulfamide compound, an iodonium compound, and a sulfonyl diazo methane compound. The specific compounds used as the photo-acid generating agent include, for example, triphenyl sulfonium triflate, diphenyl iodonium triflate, 2,3,4,4-tetrahydroxy benzophenone-4-naphthoquinone diazide sulfonate, 4-N-phenyl amino-2-methoxy phenyl diazonium sulfonate, 4-N-phenyl amino-2-methoxy phenyl diazonium p-ethyl phenyl sulfonate, 4-N-phenyl amino-2-methoxy phenyl diazonium 2-naphtyl sulfate, 4-N-phenyl amino-2-methoxy phenyl diazonium phenyl sulfate, 2,5-diethoxy-4-N-4'-methoxy phenyl carbonyl phenyl diazonium 3-carboxy-4-hydroxy phenyl sulfate, 2-methoxy-4-N-phenyl phenyl diazonium 3-carboxy-4-hydroxy phenyl sulfate, diphenyl sulfonyl methane, diphenyl sulfonyl diazo methane, diphenyl disulfone, α-methyl benzoin tosylate, pyrogallol trimesylate, benzoin tosylate, MPI-103 (CAS. NO. [87709-41-9]) manufactured by Midori Kagaku K. K., DBS-105 (CAS. NO. [145612-66-4]) manufactured by Midori Kagaku K. K., NDS-103 (CAS. NO. [110098-97-0]) manufactured by Midori Kagaku K. K., MDS-203 (CAS. NO. [127855-15-5]) manufactured by Midori Kagaku K. K., Pyrogallol tritosylate (CAS. NO. [20032-64-8]) manufactured by Midori Kagaku K. K., DTS-102 (CAS. NO. [75482-18-7]) manufactured by Midori Kagaku K. K., DTS-103 (CAS. NO. [71449-78-0]) manufactured by Midori Kagaku K. K., MDS-103 (CAS. NO. [127279-74-7]) manufactured by Midori Kagaku K. K., MDS-105 (CAS. NO. [116808-67-4]) manufactured by Midori Kagaku K. K., MDS-205 (CAS. NO. [81416-37-7]) manufactured by Midori Kagaku K. K., BMS-105 (CAS. NO. [149934-68-9]) manufactured by Midori Kagaku K. K., TMS-105 (CAS. NO. [127820-38-6]) manufactured by Midori Kagaku K. K., NB-101 (CAS. NO. [20444-09-1]) manufactured by Midori Kagaku K. K., NB-201 (CAS. NO. [4450-68-4]) manufactured by Midori Kagaku K. K., DNB-101 (CAS. NO. [114719-51-6]) manufactured by Midori Kagaku K. K., DNB-102 (CAS. NO. [131509-55-2]) manufactured by Midori Kagaku K. K., DNB-103 (CAS. NO. [132898-35-2]) manufactured by Midori Kagaku K. K., DNB-104 (CAS. NO. [132898-36-3]) manufactured by Midori Kagaku K. K., DNB-105 (CAS. NO. [132898-37-4]) manufactured by Midori Kagaku K. K., DAM-101 (CAS. NO. [1886-74-4]) manufactured by Midori Kagaku K. K., DAM-102 (CAS. NO. [28343-24-0]) manufactured by Midori Kagaku K. K., DAM-103 (CAS. NO. [14159-45-6]) manufactured by Midori Kagaku K. K., DAM-104 (CAS. NO. [130290-80-1]), CAS. NO. [130290-82-3]) manufactured by Midori Kagaku K. K., DAM-201 (CAS. NO. [28322-50-1]) manufactured by Midori Kagaku K. K., CMS-105, DAM-301 (CAS. NO. [138529-81-4]) manufactured by Midori Kagaku K. K., SI-105 (CAS. No. [34694-40-7]), NDI-105 (CAS. NO. [133710-62-0]) manufactured by Midori Kagaku K. K., and EPI-105 (CAS. NO. [135133-12-9]) manufactured by Midori Kagaku K. K.

It is desirable for the photo-acid generating agent to have a high sensitivity to the exposing light wavelength of 380 nm to 700 nm used for the recording in the recording medium. The photo-acid generating agent, which is sensitized to the light having a wavelength of about 400 nm so as to exhibit a high quantum efficiency, includes, for example, a halogenated triazine derivative represented by following general formula (2):

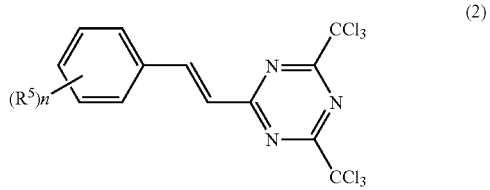

(2)

where $R^5$ denotes a hydrogen atom or a monovalent substituent group selected from the group consisting of, for example, a linear or branched alkyl group, an aryl group, an alkoxy group, a halogen atom, a cyano group, a nitro group, a carbonyl group, and a sulfonyl group, and n is an integer of 0 to 5. It is possible for these substituent groups to be equal to each other or different from each other.

It is also possible to add as required an assistant such as a coloring matter for improving the sensitivity and an acid multiplication agent for chemically multiplying the acid molecules generated by irradiating the light. The acid multiplication agents disclosed in, for example, Japanese Patent Disclosure (Kokai) No. 2000-35665, can be suitably used.

The photo-acid generating agents noted above can be used singly or in the form of a mixture of different kinds of the photo-acid generating agents. Also, it is desirable for the photo-acid generating agent to be contained in the recording layer in an amount of about 0.1 to 15% by weight based on the amount of the polymer. Where the amount of the photo-acid generating agent is smaller than 0.1% by weight, the acid cleaving reaction is rendered insufficient, which makes it difficult to achieve the recording. On the other hand, where the amount of the photo-acid generating agent exceeds 15% by weight, the transmittance of the film in respect of the wavelength of the light used for the light exposure is lowered, with the result that it is possible for an acid not to be generated in an amount sufficient for the cleaving reaction in a deep portion of the film.

It is possible for the recording layer according to the embodiment of the present invention to contain a polymerization initiating agent in an amount of about 0.1 to 15% by weight based on the amount of the polymer in addition to the polymer and the photo-acid generating agent. The polymerization initiating agent, which performs the function of initiating the polymerization reaction of the polymerizable group included in the polymer, can be selected appropriately in accordance with the kind of polymerizable group. For example, a compound similar to the photo-acid generating agent used for the dissociation from the polymer backbone chain can be used in respect of a hetero ring capable of a ring scission polymerization, such as an epoxy group that carries out, for example, a cationic polymerization.

Further, it is possible to use a compound that generates silanol upon light irradiation in combination with an organometallic compound as disclosed in Japanese Patent Disclosure No. 61-195113.

A radical series photopolymerization initiating agent, for example, Irgacure 784, 819, 1850, 1800, 1700, 194, 907 and 369 manufactured by Chiba Specialty Chemicals Inc.

Since the polymerization initiating agent is required to exhibit its function upon irradiation with a recording light, it is possible to add a substance having a sensitivity to the wavelength of the recording light or an assistant such as a coloring matter for imparting a sensitivity.

As the reaction initiating agents for initiating the dissociation reaction of the polymerizable group caused by the cleaving reaction from the polymer side chain and for initiating the polymerization reaction of the polymerizable substituent group, it is possible to add different reaction initiating agents in accordance with the reaction characteristics. Alternatively, it is also possible to add a single kind of reaction initiating agent capable of bringing about the both reactions. Particularly, where the epoxy group constitutes the polymerizable group, the polymerization reaction can be performed in the presence of an acid catalyst formed by the light irradiation.

The compound bonded to the polymerizable group is required to bring about an optical change sufficient for carrying out proper holographic optical recording. It is desirable for a high contrast in the refractive index and Δn to be generated between the matrix polymer skeleton, to which the polymerizable group is initially bonded, and the photopolymer formed by the cleavage that is brought about by the light exposure and the subsequent polymerization. A high contrast refractive index permits increasing the intensity of the recorded hologram so as to make it possible to record a greater number of holograms. It follows that, where the matrix polymer skeleton has a relatively high refractive index, it is advantageous to select a compound having a structure of a low refractive index as the polymerizable group. Also, where the matrix polymer has a relatively low refractive index, it is advantageous to select a compound having a high refractive index as the polymerizable group.

In selecting a suitable combination, it is desirable to use, for example, an aromatic compound or a compound having a halogen-containing substituent group as the structure having a high refractive index in combination with, for example, an aliphatic compound or a silicone series compound used as the structure having a relatively low refractive index.

The raw material solution for a recording layer can be obtained by dissolving the polymer, the photo-acid generating agent, and, as required, the polymerization initiating agent in an organic solvent. The organic solvent includes, for example, ketone series solvents such as tetrahydrofuran (THF), cyclohexanone, acetone, ethyl methyl ketone, methyl isobutyl ketone; cellosolve series solvents such as methyl cellosolve, methyl cellosolve acetate, ethyl cellosolve and butyl cellosolve acetate; and ester series solvents such as ethyl acetate, butyl acetate, isoamyl acetate, γ-butyrolactone, and methyl 3-methoxy propionate. Further, depending on the photosensitive composition used, it is also possible to use dimethyl sulfoxide, dimethyl formamide or N-methyl pyrrolidinone as the solvent in order to enhance the solubility of the photosensitive composition in the solvent. Also, in recent years, lactic acid esters such as ethyl lactate and PGMEA (propylene glycol monoethyl acetate) are taken up as candidates of a solvent having a low toxicity.

These solvents can be used singly or in the form of a mixture. A recording layer can be formed by casting the raw material solution on a transparent substrate, followed by heating the substrate at 50° C. to 130° C. so as to remove the solvent by evaporation. It is possible for the transparent substrate to be formed of, for example, glass, polycarbonate, or polymethyl methacrylate. The thickness of the recording layer is generally about 1 μm to 800 m, though the thickness can be determined appropriately in view of, for example, the set memory capacity and the transmittance of the film at the wavelength of the recording light.

FIG. 1 is a cross sectional view schematically exemplifying the construction of a recording medium 1 according to the embodiment of the present invention. As shown in the drawing, the recording medium 1 according to the embodiment of the present invention comprises a transparent substrate 2 and a recording layer 3 formed on the transparent substrate 2. It is possible to form an organic or inorganic protective layer on the recording layer 3, as required.

The recording medium 1 is irradiated with a recording light and a reference light such that the recording light and the reference light intersect each other within the recording layer 3. As a result, an interference takes place between the recording light and the reference light, thereby forming a hologram in the modulated region. It is possible for the holographic optical recording system to be of a transmission type or of a reflection type.

Figure 2:
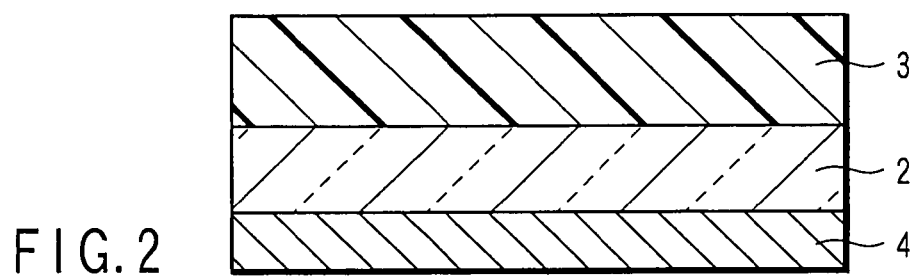
FIG. 2 is a cross sectional view schematically showing the construction of the recording medium according to another embodiment of the present invention.

The holographic optical recording system using the recording layer according to the embodiment of the present invention will now be described, with a polarized colinear system taken up as an example. Where the recording medium is used for the reflection type system, a reflecting layer 4 is formed on the back surface of the transparent substrate 2, as shown in FIG. 2. It is desirable for the reflecting layer 4 to be formed of a thin film material of the total reflection type relative to, for example, the operating wavelength. For example, it is desirable to use an Al alloy or an Ag alloy for forming the reflecting layer 4 relative to the wavelength of 400 nm to 780 nm. If the wavelength is 650 nm or greater, an additional material such as Au, a Cu alloy or TiN is added to the Al alloy or the Ag alloy noted above. The thickness of the reflecting layer 4 is determined to permit the total reflection. To be more specific, the reflecting layer 4 preferably has a thickness not less than 50 nm and more preferably a thickness not less than 100 nm.

Figure 3:
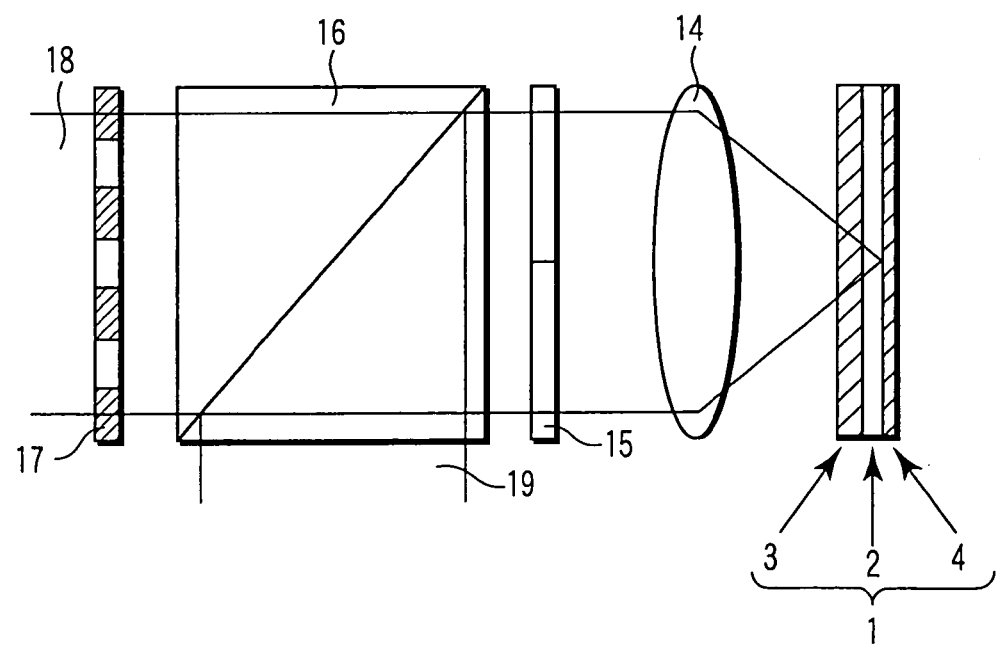
FIG. 3 schematically shows the concept of the pick-up section included in the polarized colinear system.

FIG. 3 shows the concept of the pick up section included in the polarized colinear system. As shown in the drawing, a recording light 18 is incident on the optical path through a space optical modulator 17, and a reference light 19 is coaxially incident directly on the optical path. The recording light 18 and the reference light 19 interfere with each other within the recording layer 3 by using a polarized beam splitter 16, a gyrator 15 and a lens 14 so as to form a hologram. The light reflected from the reflecting layer 4 is detected as a reproduced light.

Figure 4:
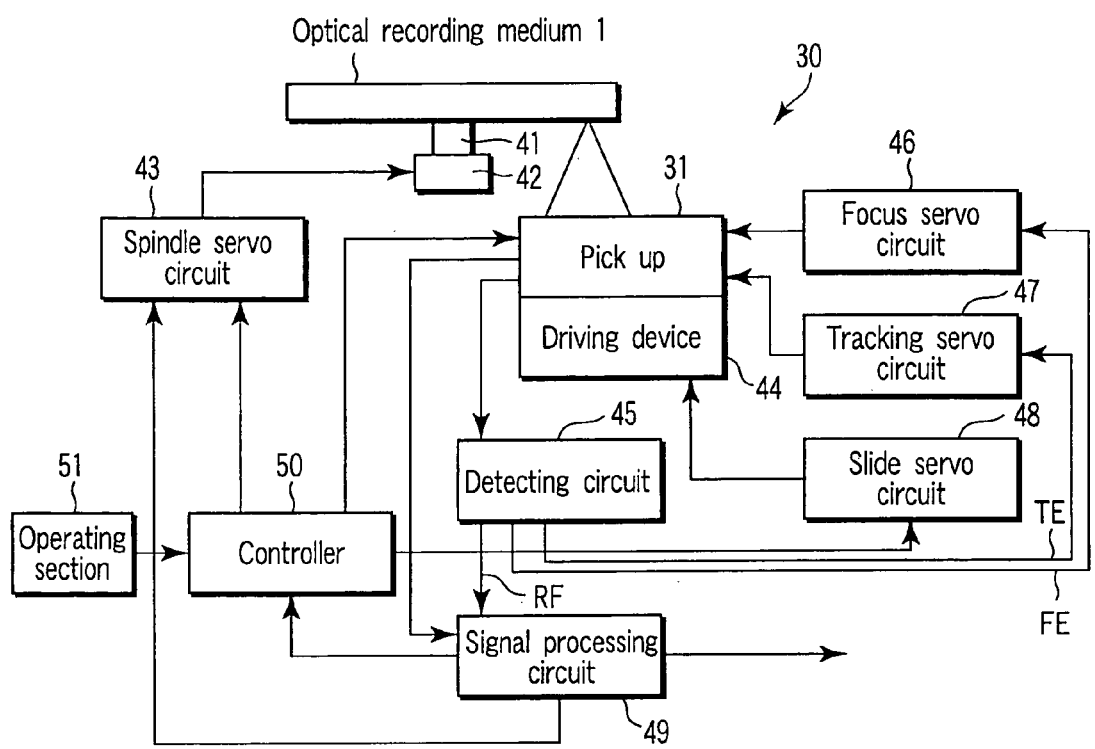
FIG. 4 schematically shows the concept of a recording apparatus having a recording medium according to one embodiment of the present invention mounted thereto.

FIG. 4 shows the construction of the recording-reproducing apparatus 30 that can be used. As shown in the drawing, the recording-reproducing apparatus 30 comprises a spindle 41 to which a recording medium 1 is mounted, a spindle motor 42 for rotating the spindle 41, and a spindle servo circuit 43 for controlling the spindle motor 42 such that the rotating speed of the recording medium 1 is maintained at a prescribed value. The recording-reproducing apparatus 30 further comprises a pick up 31 and a driving device 44 that permits the pick up 31 to be movable in a radial direction of the recording medium 1. The pick up 31 permits the recording medium 1 to be irradiated with an information light and a reference light for the recording so as to record the information in the recording medium 1. The pick up 31 also permits the recording medium 1 to be irradiated with a reference light for the reproduction so as to reproduce the information recorded in the recording medium 1.

The recording-reproducing apparatus 30 further comprises a detecting circuit 45, a focus servo circuit 46, a tracking servo circuit 47, and a slide servo circuit 48. The detecting circuit 45 detects a focus error signal FE, a tracking error signal TE, and a reproduced signal RF upon receipt of an output signal of the pick up 31. Based on the focus error signal FE detected by the detecting circuit 45, the focus servo circuit 46 drives an actuator arranged within the pick up 31 so as to move an objective lens in a thickness direction of the recording medium 1, thereby performing the focus servo operation. Based on the tracking error signal TE detected by the detecting circuit 45, the tracking servo circuit 47 drives the actuator arranged within the pick up 31 so as to move the objective lens in a radial direction of the recording medium 1, thereby performing the tracking servo operation. Further, based on the tracking error signal and an instruction from a controller described herein later, the slide servo circuit 48 controls the driving device 44 so as to move the pick up 31 in a radial direction of the recording medium 1, thereby performing the slide servo operation.

Still further, the recording-reproducing apparatus 30 comprises a signal processing circuit 49, a controller 50 and an operating section 51. The signal processing circuit 49 decodes the output data of a CCD array within the pick up 31 so as to reproduce the data recorded in the data area of the recording medium 1. The signal processing circuit 49 also serves to permit the reproduced signal RF supplied from the detecting circuit 45 to reproduce the base clock signal and to discriminate the address. The controller 50 controls the entire recording-reproducing apparatus 30. Further, the operating section 51 supplies various instructions to the controller 50. The controller 50 inputs the base clock pulse and the address information generated from the signal processing circuit 49 to be inputted, and controls the pick up 31, the spindle servo circuit 43 and the slide servo circuit 48.

The base clock signal generated from the signal processing circuit 49 is inputted into the spindle servo circuit 43. A central processing unit (CPU), a read only memory (ROM), and a random access memory (RAM) are arranged within the controller 50. The CPU executes the program housed in the ROM with the RAM providing the working region so as to permit the controller 50 to perform its function.

In the pick up 31, the recording light 18 and the reference light 19 are converged, and the recording medium 1 is irradiated with the converged light, as shown in FIG. 3. The polarized beam splitter 16 and the gyrator 15 cause the recording light 18 incident on the recording layer 3 and the reference light 19 passing through the recording layer 3 and reflected from the reflecting layer 4 to interfere with each other. At the same time, the reference light incident on the recording layer 3 interferes with the recording light passing through the recording layer 3 and reflected from the reflecting layer 4.

If the recording medium according to the embodiment of the present invention is irradiated with light for recording information in the recording medium, the phenomenon given below is generated within the recording layer. Specifically, an acid is generated from the photo-acid generating agent. As a result, the acid cleaving group in the polymer is cleaved so as to dissociate the polymerizable substituent group from the side chain. Since the number of molecules within the recording layer is increased by the cleavage, the volume of the recording layer is increased. In other words, the recording layer is expanded. On the other hand, the number of molecules is decreased, if the polymerizable substituent group dissociated from the side chain is polymerized, with the result that the volume of the recording layer is decreased. It follows that, in the recording medium according to the embodiment of the present invention, the volume of the recording layer is compensated.

What should also be noted is that, since the raw material composition of the recording layer according to the embodiment of the present invention contains high molecular weight compounds as the main component, a holding medium other than the substrate is not particularly required in the film-forming step. It should be noted that the high molecular weight compounds are not evaporated from the composition forming the recording layer and, thus, phase separation does not take place after the film-forming step. The film quality is thus prevented from becoming nonuniform.

An example of the present invention will now be described. Naturally, the present invention in respect of the materials and the manufacturing process is not limited at all to the example described in the following.

Specifically, a polymer for this example was synthesized in accordance with the reactions denoted by the following reaction formula:

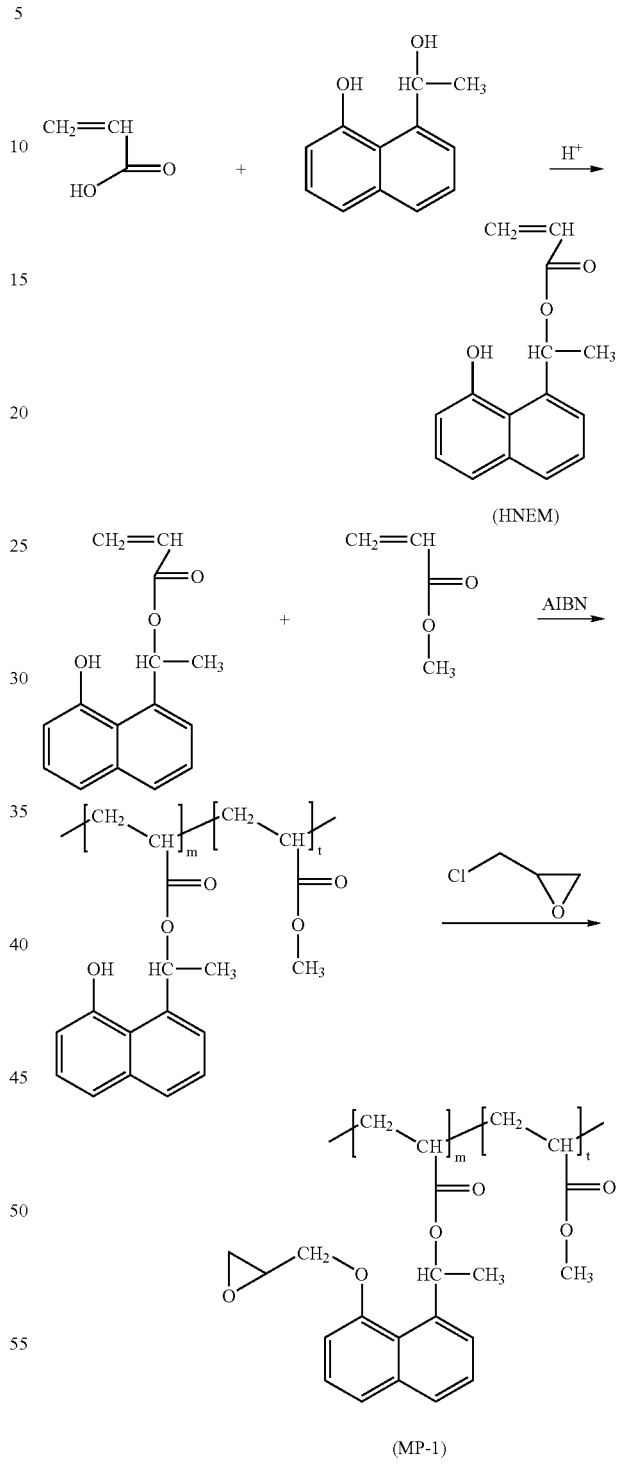

In the first step, equimolar amounts of methacrylic acid and 8-hydroxy-α-methyl-1-naphthalene methanol were dissolved in THF (tetrahydrofuran), and the resultant solution was kept stirred for 3 hours under a nitrogen gas atmosphere while adding traces of hydrochloric acid to the solution. Then, the reaction mixture was added to water and extracted with an acetic acid ester, followed by washing the organic phase with a separatory funnel until the washing water was rendered neutral. The organic material thus obtained was found to be a mixture containing the reaction product and the raw material. The mixture was separated by column chromatography so as to obtain 1-(8'-hydroxy-1'-naphthalene) ethyl acrylate (HNEA).

Methyl acrylate (MA) and HNEA were dissolved at a ratio of 3:7 in THF, and a small amount of AIBN (2,2'-azobis isobutyronitrile) was added to the resultant solution so as to carry out the reaction at 60° C. for 24 hours. Further, the reaction mixture was precipitated again within methanol so as to obtain a copolymer between MA and HNEA. The copolymer was dissolved in a THF solution, followed by adding epichlorohydrin to the reaction system in an amount that was 1.2 times as much as the amount of HNEA unit. Then, the solution was vigorously stirred while dripping a 2% aqueous solution of potassium carbonate into the reaction system. After the dripping, the reaction system was further stirred for one hour, followed by pouring the reaction system into an excess amount of water so as to separate the precipitated polymer by filtration.

The polymer (MP-1) thus obtained was dissolved again in THF and, then, refined by precipitating the dissolved polymer out of the methanol, thereby removing the unreacted low molecular weight compounds. In the polymer (MP-1), "—CH(CH$_3$)—" corresponds to the substituent group portion that is cleaved by the acid catalyst, and the epoxy group corresponds to the polymerizable substituent group portion. Incidentally, each of m and l in the polymer (MP-1) is an integer of 2 or more.

The polymer (MP-1) was dissolved in THF, and the compound represented by following chemical formula (PAG1), which was used as a photo-acid generating agent, was added to the resultant solution in an amount of 3% of the polymer weight. In this example, the polymerizable group was provided by a cationic polymerizable compound and, thus, the acid generating agent also performed the function of a polymerization initiating agent of the polymerizable group. It follows that it was not particularly necessary to add another polymerization agent.

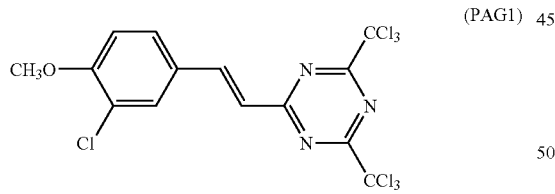

(PAG1)

A glass substrate was coated with the resultant solution by the casting method, followed by heating the glass substrate at 50° C. so as to remove the solvent by evaporation, thereby forming a polymer film having a thickness of 100 μm on the glass substrate.

The polymer film thus formed was irradiated with light emitted from the conventional ultraviolet mineral lamp having a short wavelength. The sample was measured one hour later by an infrared spectrum. It was confirmed that acrylic acid had been generated. Also, the absorption of 830 nm wavelength light caused by the epoxy group was decreased. Further, the film thickness 24 hours later was observed by the alpha step, with the result that no change was recognized from the initial film thickness.

The reaction represented by the reaction formula given below is considered to take place within the polymer film after the light irradiation:

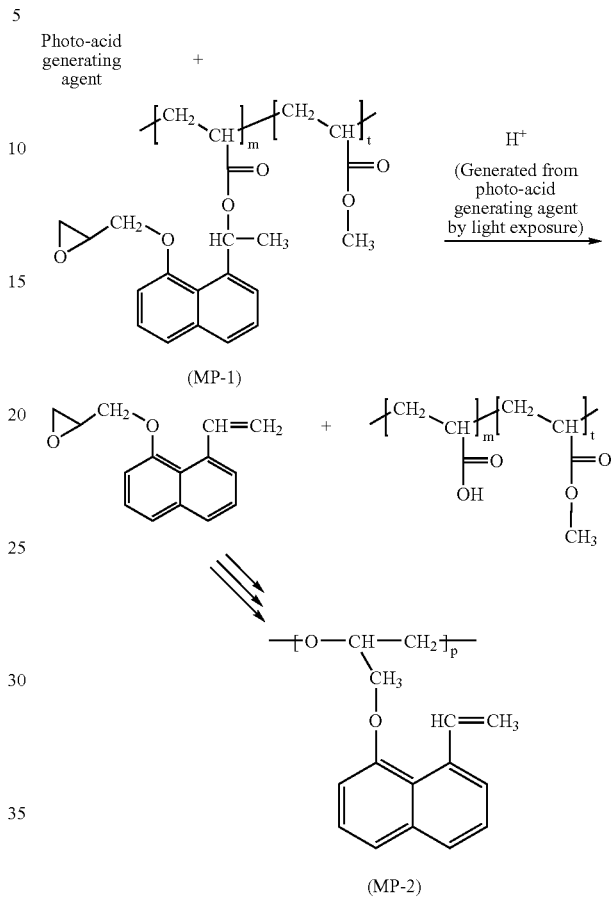

As shown in the reaction formula given above, an acid (H+) is generate from the photo-acid generating agent as a result of the light exposure. The acryl ester portion is cleaved by the catalytic action of the acid thus generated so as to form acrylic acid. Since the number of molecules is increased by the cleavage, the polymer film is expanded. Then, the epoxy group constituting the polymerizable substituent group is subjected to cationic polymerization so as to form a polymer (MP-2). The number "p" in the polymer (MP-2) was found to be an integer of 2 or more. The polymer film is shrunk by the decrease in the number of molecules, with the result that the volume of the polymer film is compensated.

For comparison, a polymer film was formed by changing the polymer (MP-1) into a low molecular weight compound, and the change in volume of the polymer film was observed. To be more specific, a raw material solution was prepared by dissolving vinyl naphthalene and a radical polymerizing agent in polymethyl acrylate used as a matrix. Then, a polymer film was prepared as above, except that the raw material solution thus prepared was used for forming the polymer film. Also, a change in the thickness of the polymer film was observed as above, with the result that the polymer film was shrunk to about 97% of the initial thickness of the polymer film. It is considered reasonable to understand that the shrinkage was caused by the polymerization of vinyl naphthalene.

As described above in detail, one embodiment of the present invention provides a material of a recording medium including a recording layer that permits suppressing the volume shrinkage caused by the recording of information.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A recording medium comprising a recording layer including a photo-acid generating agent that generates an acid upon irradiation with an actinic radiation and a polymer having a polymerizable substituent group bonded to a main chain of the polymer via a functional group that cleaves in the presence of the acid and having a repeating unit represented by following general formula (1):

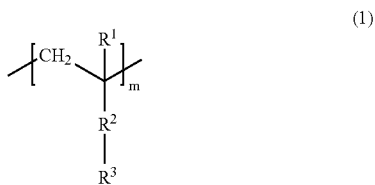

(1)

wherein $R^1$ denotes a hydrogen atom, a halogen atom, a cyano group or a monovalent organic group, $R^2$ denotes a bivalent organic group being cleaved by an acid catalyst to dissociate $R^3$, $R^3$ denotes a monovalent organic group having at least one polymerizable substituent group, and m is an integer of 2 or more.

2. The recording medium according to claim 1, wherein the recording layer further comprises a polymerization initiating agent that permits polymerizing the polymerizable substituent group included in the polymer.

3. The recording medium according to claim 1, wherein the monovalent organic group represented by $R^1$ has one or two carbon atoms.

4. The recording medium according to claim 1, wherein the bivalent organic group $R^2$ in the general formula (1) is selected from the group consisting of a linear or branched alkyl group, a cyclic alkyl group, a hetero ring, and an aromatic ring.

5. The recording medium according to claim 1, wherein $R^2$ further comprises a bivalent organic group selected from the group consisting of a substituted or unsubstituted and cyclic or linear alkyl group, a phenyl group, a carbonyl group, and a sulfonyl group.

6. The recording medium according to claim 1, wherein $R^2$ includes at least one selected from the group consisting of esters, ethers, alkoxy carbonates, acetals, ketals, cyanohydrins, and alicyclic skeletons capable of dissociation.

7. The recording medium according to claim 1, wherein the polymerizable substituent group contained in $R^3$ includes an unsaturated group selected from the group consisting of acryl, epoxy, oxetane, lactam, oxazole and lactone.

8. The recording medium according to claim 1, wherein the polymer having the repeating unit represented by the general formula (1) is a homopolymer.

9. The recording medium according to claim 1, wherein the polymer having the repeating unit represented by the general formula (1) is a copolymer.

10. The recording medium according to claim 9, wherein the copolymer has at least 10% of the repeating unit represented by the general formula (1).

11. The recording medium according to claim 1, wherein the polymer has a glass transition temperature not lower than 40° C.

12. The recording medium according to claim 1, wherein the photo-acid generating agent includes at least one compound selected from the group consisting of an aryl onium salt, a naphthoquinone diazide compound, diazonium salt, a sulfonate compound, a sulfonium compound, a sulfamide compound, an iodonium compound, and a sulfonyl diazo methane compound.

13. The recording medium according to claim 1, wherein the photo-acid generating agent has a photosensitivity over a wavelength range of from between 380 nm to 700 nm.

14. The recording medium according to claim 1, wherein the photo-acid generating agent comprises a halogenated triazine derivative represented by following general formula (2):

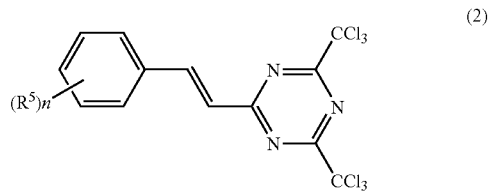

(2)

wherein $R^5$ denotes a hydrogen atom or a monovalent substituent group, and n is an integer of 0 to 5.

15. The recording medium according to claim 1, wherein the photo-acid generating agent is mixed in an amount of 0.1 to 15% by weight based on the amount of the polymer.

16. The recording medium according to claim 1, wherein the photo-acid generating agent comprises a compound represented by following chemical formula (PAG1)

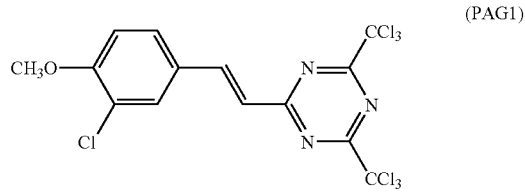

(PAG1)

17. The recording medium according to claim 1, wherein the recording layer further comprises a polymerization initiating agent that permits polymerizing the polymerizable substituent group.

18. The recording medium according to claim 1, wherein the backbone chain of the polymer includes a structure selected from the group consisting of an aromatic compound and a compound having a halogen-containing substituent group, and the polymerizable substituent group includes a structure selected from the group consisting of an aliphatic compound and a silicone series compound.

19. The recording medium according to claim 1, wherein the backbone chain of the polymer includes a structure selected from the group consisting of an aliphatic compound and a silicone series compound, and the polymerizable substituent group includes a structure selected from the group consisting of an aromatic compound and a compound having a halogen-containing substituent group.

* * * * *